United States Patent
Sutardja

(10) Patent No.: US 9,007,135 B1
(45) Date of Patent: *Apr. 14, 2015

(54) SLEW RATE EDGE ENHANCER

(71) Applicant: Marvell International Ltd., Hamilton (BM)

(72) Inventor: Sehat Sutardja, Los Altos Hills, CA (US)

(73) Assignee: Marvell International Ltd., Hamilton (BM)

( * ) Notice: Subject to any disclaimer, the term of this patent is extended or adjusted under 35 U.S.C. 154(b) by 0 days.

This patent is subject to a terminal disclaimer.

(21) Appl. No.: 14/159,881

(22) Filed: Jan. 21, 2014

Related U.S. Application Data

(63) Continuation of application No. 13/545,620, filed on Jul. 10, 2012, now Pat. No. 8,638,176, which is a continuation of application No. 12/686,773, filed on Jan. 13, 2010, now Pat. No. 8,217,727.

(60) Provisional application No. 61/169,523, filed on Apr. 15, 2009.

(51) Int. Cl.
*H03B 1/00* (2006.01)
*H03K 5/12* (2006.01)

(52) U.S. Cl.
CPC ........................................ *H03K 5/12* (2013.01)

(58) Field of Classification Search
USPC ............. 331/74, 158, 108 R, 167, 10–12, 45; 327/231, 237, 393, 396, 538
See application file for complete search history.

(56) References Cited

U.S. PATENT DOCUMENTS

| | | |
|---|---|---|
| 7,154,350 B2 | 12/2006 | Seki |
| 7,592,875 B2 | 9/2009 | Maget et al. |
| 7,755,413 B2 | 7/2010 | Wong |
| 7,872,515 B1 | 1/2011 | Kuo |
| 8,638,176 B1 * | 1/2014 | Sutardja ........................ 331/74 |
| 2005/0110579 A1 | 5/2005 | Raha |
| 2006/0255869 A1 | 11/2006 | Kawashima |

* cited by examiner

*Primary Examiner* — Joseph Chang
*Assistant Examiner* — Jeffrey Shin

(57) ABSTRACT

A slew rate enhancing system includes a first input configured to receive a first complementary signal of a differential pair and a second input configured to receive a second complementary signal of the differential pair. The slew rate enhancing system further includes a first switch configured to selectively connect the first input to an output in response to a voltage of the second input being greater than a first predetermined voltage. The slew rate enhancing system further includes a second switch configured to selectively connect the first input to the output in response to the voltage of the second input being less than a second predetermined voltage.

21 Claims, 6 Drawing Sheets

SLEW RATE EDGE ENHANCER

CROSS-REFERENCE TO RELATED APPLICATIONS

This is a continuation of U.S. patent application Ser. No. 13/545,620 (now U.S. Pat. No. 8,638,176), filed on Jul. 10, 2012, which is a continuation of U.S. patent application Ser. No. 12/686,773 (now U.S. Pat. No. 8,217,727), filed on Jan. 13, 2010, which claims the benefit of U.S. Provisional Application No. 61/169,523, filed on Apr. 15, 2009. The entire disclosures of the above applications are incorporated herein by reference.

FIELD

The present disclosure relates to slew rates of periodic signals and more particularly to devices that enhance slew rates of periodic signals.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

Referring now to FIG. 1, an oscillator 102 outputs a sine wave to an inverter 104. The oscillator 102 may include a crystal oscillator or an oscillator having an LC resonance circuit, where the L refers to inductance and the C refers to capacitance. Although the oscillator 102 outputs a sine wave, many circuits require a square wave.

For example, a circuit 106 may operate based on a square wave clock signal output from the inverter 104. In order to produce the square wave clock signal, the sine wave input to the inverter 104 is increased in amplitude. When driven with a small sinusoidal input, the inverter 104 outputs a sinusoidal output signal. As the input sinusoidal signal gets larger in amplitude, the inverter 104 eventually saturates, outputting a signal more closely resembling a square wave.

As the input sinusoidal signal gets larger, the inherent noise of the inverter 104 becomes less significant in proportion to the input signal. The larger input sinusoidal signal, however, requires that the oscillator 102 have greater voltage headroom. Power dissipation also increases as the input sinusoidal signal gets larger. Further, at some point, the input sinusoidal signal may exceed limits of the inverter 104. For example only, breakdown voltages of components of the inverter 104 may be exceeded, which may result in unpredictable behavior and/or damage to the inverter 104.

SUMMARY

A slew rate enhancing system is disclosed. The slew rate enhancing system includes a first switch and a second switch each having a control terminal, a first terminal, and a second terminal. The first terminals of the first and second switches receive a first signal of a differential signal pair. The control terminals of the first and second switches receive a second signal of the differential signal pair. A first output is connected to the second terminals of the first and second switches.

The slew rate enhancing system may be used in conjunction with a square wave conversion system to efficiently produce square wave signals. The slew rate enhancing system may also be used in conjunction with a crystal oscillator and/or an LC oscillator to efficiently enhance the slew rate of oscillator signals. Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF DRAWINGS

The present disclosure will become more fully understood from the detailed description and the accompanying drawings, wherein.

DESCRIPTION

Figure 1:
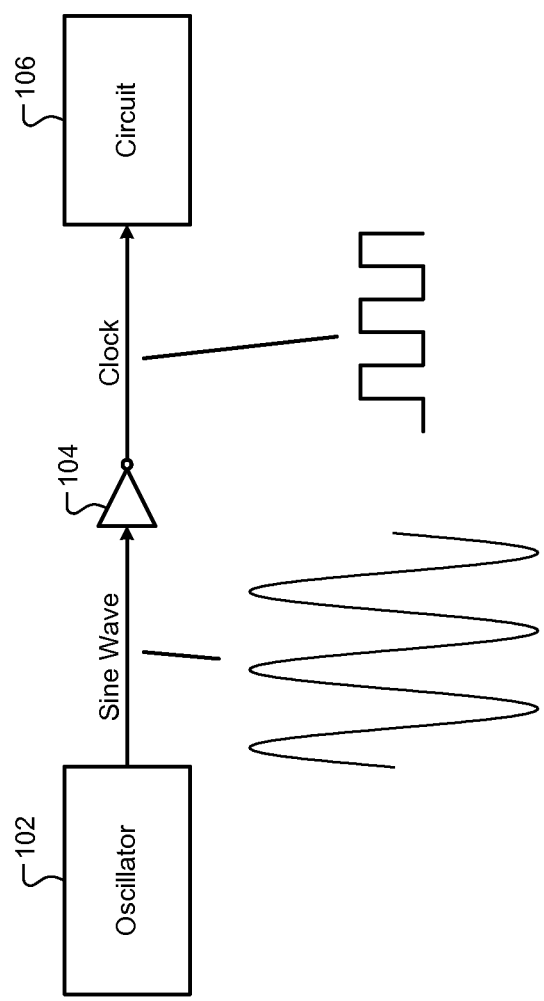
FIG. 1 is a functional block diagram of a square wave generation system according to the prior art.

The following description is merely exemplary in nature and is in no way intended to limit the disclosure, its application, or uses. For purposes of clarity, the same reference numbers will be used in the drawings to identify similar elements. As used herein, the phrase at least one of A, B, and C should be construed to mean a logical (A or B or C), using a non-exclusive logical OR. It should be understood that steps within a method may be executed in different order without altering the principles of the present disclosure.

As used herein, the term module may refer to, be part of, or include an Application Specific Integrated Circuit (ASIC), an electronic circuit, a processor (shared, dedicated, or group) and/or memory (shared, dedicated, or group) that execute one or more software or firmware programs, a combinational logic circuit, and/or other suitable components that provide the described functionality.

Amplifiers, such as the inverter 104 of FIG. 1, have an inherent amount of noise, which is amplified along with the input signal. The effect of the noise is proportionally greater as the input signal gets smaller. Therefore, when amplifying a signal that has a common-mode zero level, the noise is proportionally greatest when the input signal is crossing the zero level. For example, an input signal oscillating between 0 Volts (V) and 2 V may be most susceptible to noise when the signal is close to 1 V. Similarly, an input signal oscillating between −1 V and 1 V may be most susceptible to noise when the signal is close to 0 V.

When the input signal is close to zero, amplifying noise, as well as other types of noise (such as power supply noise), affects the output of the amplifier. For example, a small amount of noise may cause the output of the amplifier to cross zero before or after the input of the amplifier crosses zero. If the amount of amplification is large, the effects of noise during zero crossing periods are even greater.

As an input signal decreases toward zero, noise that acts in a negative direction may cause the input signal to artificially appear as being less than zero. This causes the zero crossing to occur before the input signal itself actually reaches zero. Similarly, as the input signal crosses zero and begins decreasing below zero, noise that acts in a positive direction may cause the input signal to appear to be above zero. This causes the zero crossing to occur later than the input signal itself actually crosses zero.

When the amplifier is producing a clock signal based on the sinusoidal input, the variance in the time of zero crossings, such as is caused by noise, is known as jitter. Jitter may negatively affect circuits relying on the clock signal, such as by violating the circuit's setup and hold times and increasing error rates.

A slew rate may be defined as the maximum rate of change of a signal. The maximum rate of change of a sinusoidal signal oscillating about a zero level occurs at the zero crossing. By increasing the slew rate of a sinusoidal signal around the zero crossing, the signal spends less time in the region around the zero level. Therefore, the effect of noise on the time of the zero crossing decreases.

A higher slew rate also causes the sinusoidal signal to more closely resemble a square wave. For a similar quality square wave, the higher slew rate may allow the input signal to be made smaller and/or the amplification of the amplifier to be decreased.

Figure 3:
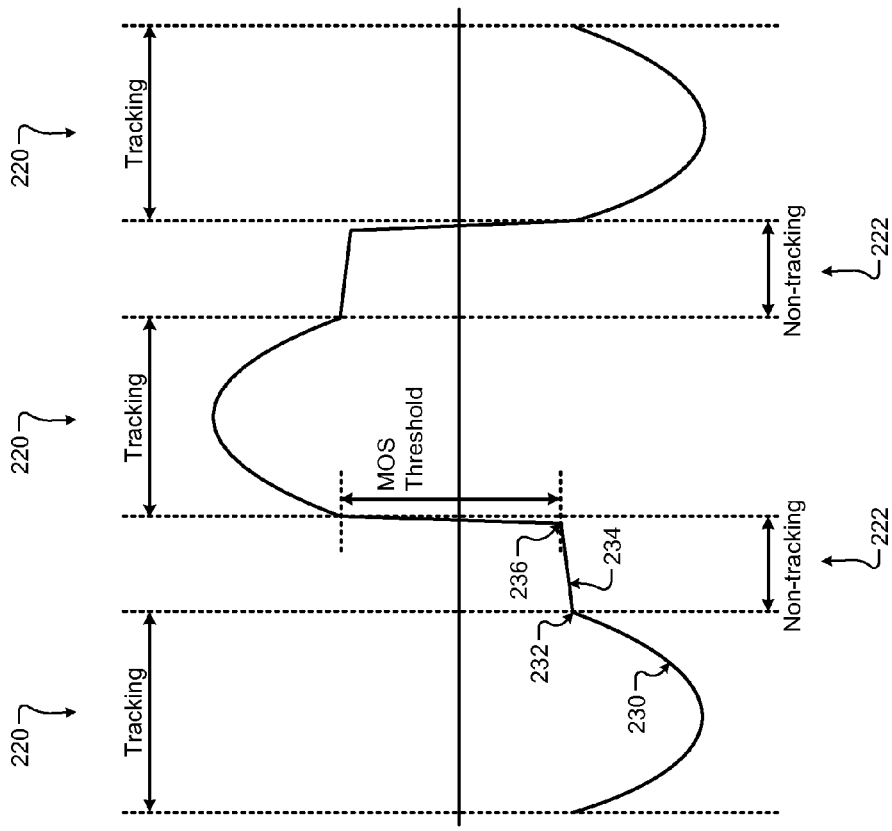
FIG. 3 is a graphical depiction of an exemplary trace of an output signal of the slew rate enhancing module.
Figure 2:
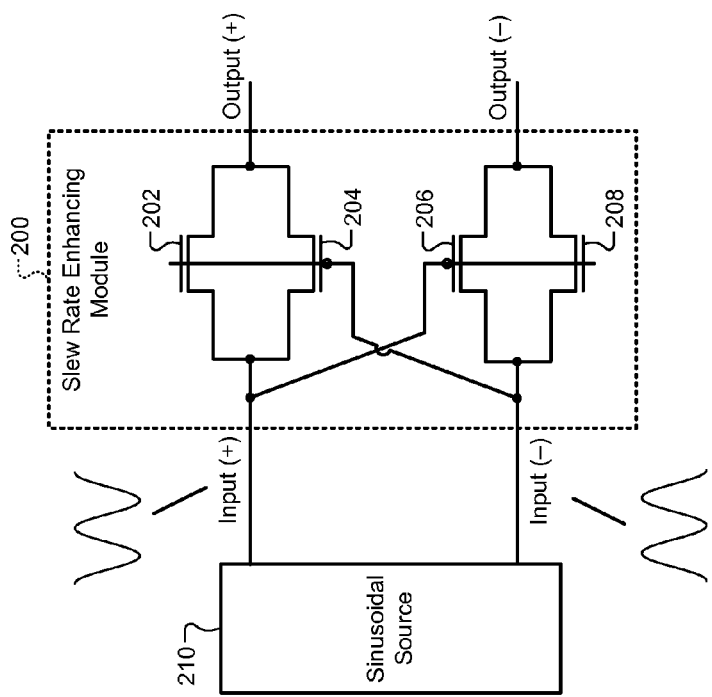
FIG. 2 is a functional block diagram of an exemplary implementation of a slew rate enhancing module.
Figure 4:
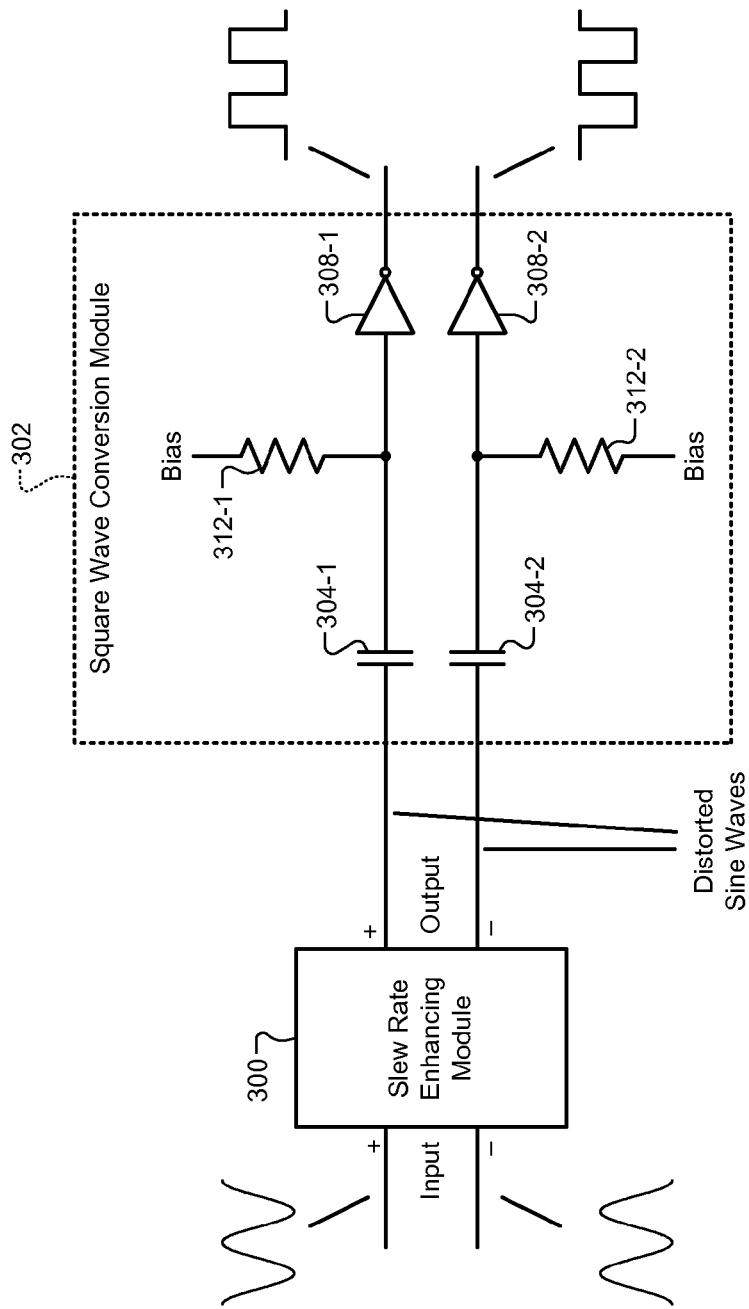
FIG. 4 is a functional block diagram of a square wave generation system including a slew rate enhancing module.
Figure 5A:
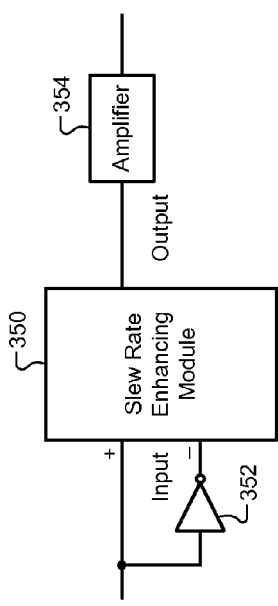
FIGS. 5A-5B are functional block diagrams of exemplary single-ended implementations of a slew rate enhancing module.
Figure 5B:
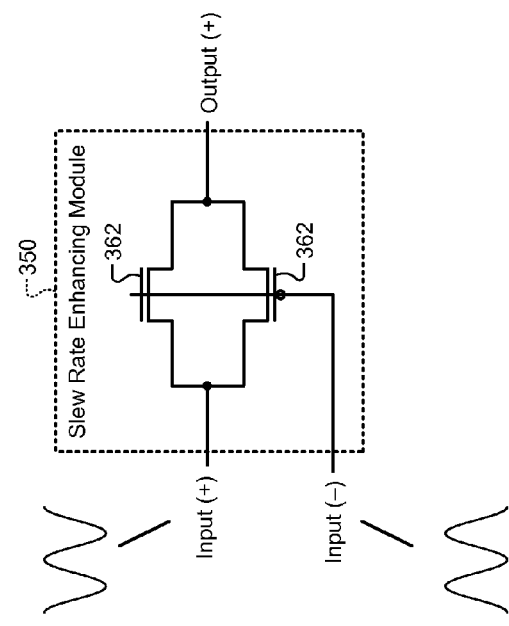

FIG. 2 shows an exemplary implementation of a module that enhances the slew rate of a sinusoidal signal. FIG. 3 shows an exemplary trace of the distorted sinusoidal signal resulting from the slew rate being enhanced. FIG. 4 shows a slew rate enhancing module used in a differential configuration. FIGS. 5A-5B show an exemplary slew rate enhancing module used in a single-ended configuration. FIGS. 6-10 depict additional systems incorporating a slew rate enhancing module.

Referring back to FIG. 2, an exemplary implementation of a slew rate enhancing module 200 includes switches 202, 204, 206, and 208. In various implementations, the switches 202, 204, 206, and 208 may be metal-oxide-semiconductor field-effect transistors (MOSFETs). In various implementations, the switches 202 and 208 may be N-channel MOSFETs, while the switches 204 and 206 may be P-channel MOSFETs.

The switches 202, 204, 206, and 208 each have a first terminal, a second terminal, and a control terminal. The first terminals of the switches 202 and 204 and the control terminals of the switches 206 and 208 receive a positive input signal from a sinusoidal source 210. The first terminals of the switches 206 and 208 and the control terminals of the switches 202 and 204 receive a negative input signal from the sinusoidal source 210. The positive and negative input signals are complementary (180 degrees out of phase) sinusoidal signals that form a differential signal pair.

The second terminals of the switches 202 and 204 are connected to a positive output. The second terminals of the switches 206 and 208 are connected to a negative output. In a pass gate, the control terminals of the switches 202 and 204 would be connected to complementary signals. By contrast, in FIG. 2, the control terminals of the switches 202 and 204 are connected to the same signal—i.e., the negative input signal.

Referring now to FIG. 3, an exemplary trace of an output of the slew rate enhancing module 200 is shown. For purposes of illustration, the trace of FIG. 3 will be described as the positive output of the slew rate enhancing module 200.

In intervals labeled 220a-c, the trace shows the positive output signal tracking the positive input signal of the slew rate enhancing module 200. In intervals labeled 222a-b, the positive output signal does not track the positive input signal.

During the non-tracking intervals 222a-b, the output signal remains approximately constant, with only a relatively small rate of change. In other words, the output signal maintains the previous latest state of the input signal and no longer follows or tracks the input signal during the non-tracking intervals 222a-b. Near the end of each of the non-tracking intervals 222a-b, the positive output signal quickly returns to tracking the positive input signal. The speed of this transition is controlled by the current delivery capability of the switches 202, 204, 206, and 208. The switches 202, 204, 206, and 208 may be sized based on desired current delivery capability. Depending on the chosen sizes, the slew rate achieved at the end of the non-tracking intervals 222a-b may be much greater than the natural slew rate of a sinusoidal signal across the zero level.

The non-tracking intervals 222a-b begin when both of the switches 202 and 204 are off and end when one of the switches 202 and 204 turns on. During each of the tracking intervals 220a-c, one of the switches 202 and 204 may be on (conducting) while the other of the switches 202 and 204 is off (non-conducting). For example only, in the first and third tracking intervals 220a,c, the switch 204 is off and the switch 202 is on. In the second tracking interval 220b, the switch 204 is on and the switch 202 is off.

Operation of the slew rate enhancing module 200 may be further explained as follows. At time 230, the positive output signal is tracking the positive input signal and is therefore low but increasing. In various implementations, the positive and negative input signals are differential waveforms, such as differential sinusoids. The negative output signal will then be approximately symmetric with the positive output signal about the x-axis.

Therefore, at time 230, the negative input signal is high but decreasing. This high negative input signal is applied to the control terminal of the switch 202. Meanwhile, the low positive output signal is applied to the second terminal of the switch 202. The difference between the high negative input voltage and the low positive input voltage is greater than a threshold voltage of the switch 202. As a result, the switch 202 is turned on.

After time 230, the negative input signal continues to decrease and the positive output signal continues to track the increasing positive input signal. At time 232, the difference between these voltages falls below the threshold voltage of the switch 202, turning the switch 202 off.

The switch 202, as well as the switch 204, may not turn on and off instantaneously. Therefore, during the first non-tracking interval 222a, such as at time 234, the positive output voltage may be increasing slowly. In addition, the positive output signal may have more rounded corners, such as at times 232 and 236.

During the first non-tracking interval 222a, the negative input voltage is decreasing and the positive input voltage is increasing. The negative input voltage is applied to the control terminal of the switch 204 and the positive input voltage is applied to the first terminal of the switch 204.

At time 236, the difference between the voltages at the first terminal and the control terminal of the switch 204 is greater than a threshold voltage of the switch 204. The switch 204 therefore turns on, quickly charging up the positive output signal to resume tracking the positive input signal. At the beginning of the second non-tracking interval 222b, the inverse process occurs, and the switch 204 turns off. Subsequently, the switch 202 turns on to end the second non-tracking interval 222b.

Referring now to FIG. 4, an exemplary slew rate enhancing module 300 receives a differential sinusoidal signal. The differential sinusoidal signal includes a first phase and a second phase. The first and second phases are sinusoidal signals 180 degrees out of phase with each other. The slew rate enhancing module 300 increases the slew rate of the sinusoidal signals around a zero crossing threshold.

The slew rate enhancing module 300 may increase the slew rate of one or both of the positive-going and negative-going zero crossings. A square wave conversion module 302 receives the distorted sinusoidal signals from the slew rate enhancing module 300. Capacitors 304-1 and 304-2 AC-couple positive and negative outputs of the slew rate enhancing module 300 to inverters 308-1 and 308-2, respectively.

The capacitors 304 block low frequencies, including DC, from the slew rate enhancing module 300. Therefore, the DC level of the inputs of the inverters 308 can be established by a bias voltage independent of the DC level at the output of the slew rate enhancing module 300. For example, the input and output signals of the slew rate enhancing module 300 may have a common-mode zero (DC) level of 0 V and oscillate between −1 V and 1 V. By contrast, the inverters 308 may accept input signals between 0 V and 2 V. The inverters 308 may therefore be biased at a common mode level of 1 V.

The bias voltage is connected to the inputs of the inverters 308-1 and 308-2 via resistors 312-1 and 312-2, respectively. Although shown in FIG. 4 as the same voltage, in various implementations, the bias voltages for the inverters 308-1 and 308-2 may be different. Outputs of the inverters 308 have a square wave shape.

The square wave shape of the outputs of the inverters 308 may not be a mathematical square wave. For example, because the inverters 308 generate signals having finite slew rates, the edges of the generated square waves may deviate from vertical. In addition, the tops and bottoms of the square waves may not be perfectly flat. Further, there may be some rounding off or overshoot at the corners of the square waves.

Referring now to FIG. 5, another exemplary implementation of the slew rate enhancing module 350 is shown. The slew rate enhancing module 350 includes switches 362 and 364, which may be similar to the switches 202 and 204 of FIG. 2. The positive and negative input signals are inverted versions of each other. In some implementations, the positive and negative input signals are provided by a signal source, such as, sinusoidal source 210 as shown in FIG. 2; in other implementations, the negative input signal may be generated by inverting the positive input signal or vice versa. The slew rate enhancing module 350 produces a single positive output that is a modified version of the positive input signal.

Figure 6:
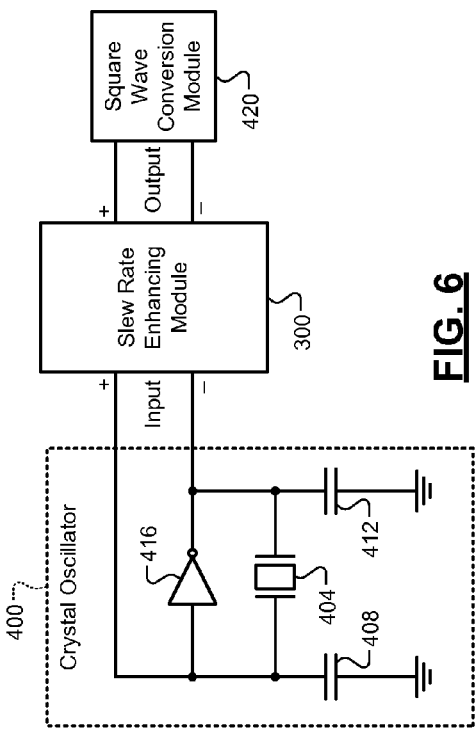

Referring now to FIG. 6, a crystal oscillator 400 includes a crystal 404, such as a piezoelectric crystal. First and second terminals of the crystal 404 are connected to a reference potential, such as ground, by first and second capacitors 408 and 412, respectively.

An inverter 416 has an input connected to the first terminal of the crystal 404 and an output connected to the second terminal of the crystal 404. The first and second terminals of the crystal 404 are used as outputs from the crystal oscillator 400, providing input signals to the slew rate enhancing module 300. Distorted sinusoidal signals from the slew rate enhancing module 300 are converted to signals having a square wave shape by a square wave conversion module 420.

Figure 7:
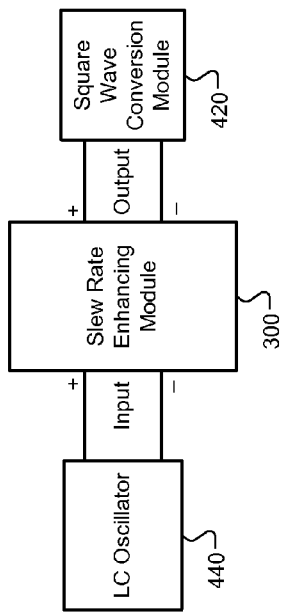
FIGS. 6-9 are functional block diagrams of exemplary systems incorporating slew rate enhancing modules.

Referring now to FIG. 7, an LC oscillator 440 outputs a differential oscillating signal to the slew rate enhancing module 300. The LC oscillator 440 may include an LC tank, where 'LC' indicates that the tank includes inductance (L) and capacitance (C). Distorted sinusoidal signals from the slew rate enhancing module 300 are converted to signals having a square wave shape by the square wave conversion module 420.

Figure 8:
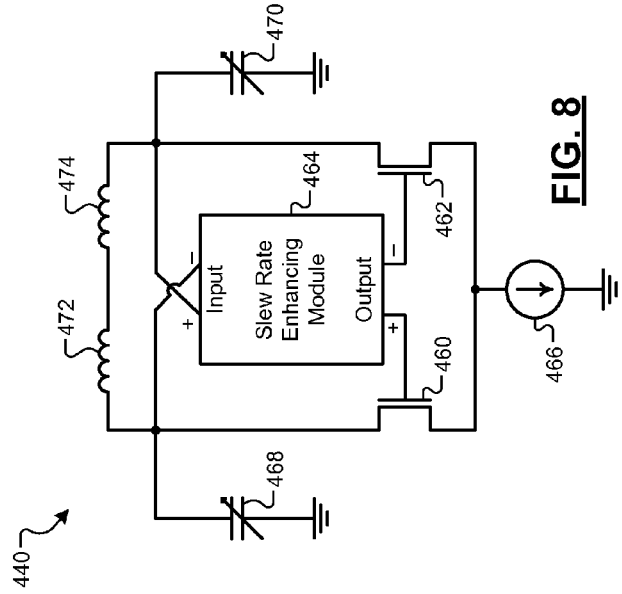

Referring now to FIG. 8, an exemplary implementation of the LC oscillator 440 and a slew rate enhancing module 464 is shown. Control terminals of first and second transistors 460 and 462 are connected to the positive and negative outputs of a slew rate enhancing module 464, respectively.

First terminals of the transistors 460 and 462 are connected to negative and positive inputs of the slew rate enhancing module 464, respectively. Second terminals of the transistors 460 and 462 are connected to a current source 466. The first terminals of the transistors 460 and 462 are also connected to variable capacitors 468 and 470, respectively. The first terminals of the transistors 460 and 462 are further connected to first ends of inductors 472 and 474, respectively. Second ends of the inductors 472 and 474 may be connected together. The first terminals of the transistors 460 and 462 may serve as the outputs of the LC oscillator 440.

The LC oscillator 440 may also include a start-up circuit (not shown). By adding the slew rate enhancing module 464, the slew rate at the zero crossings of the transistors 460 and 462 is increased. The effect of noise at the transistors 460 and 462 is thereby decreased. This may improve specifications of the LC oscillator, such as phase noise.

The slew rate enhancing module 464 can be used in other configurations of oscillators. For example, oscillation can be created by negative resistance or negative transconductance. In the LC oscillator 440, negative transconductance is provided by the transistors 460 and 462. However, a slew rate enhancing module can be connected at the input of other forms of negative transconductance or resistance. The slew rate enhancing module serves to decrease the operating time around the zero crossing threshold.

Figure 9:
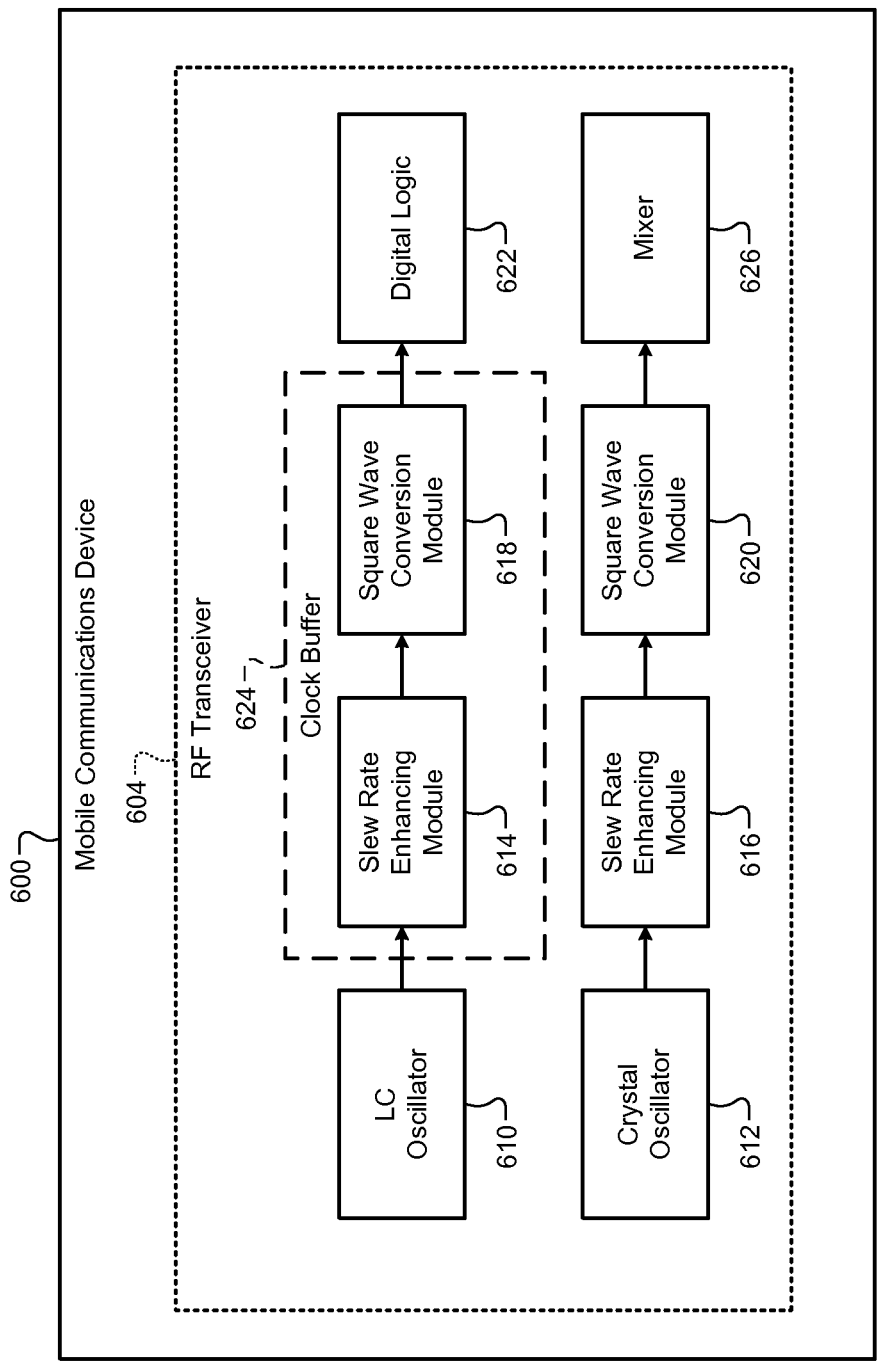

Referring now to FIG. 9, a mobile communicates device 600, such as a mobile phone or networked media player, includes a radio frequency (RF) transceiver 604. For example only, the RF transceiver 604 may be part of a second generation (2G), third generation (3G), and/or long-term evolution (LTE) implementation, where clock performance is important.

First and second oscillators 610 and 612 output sinusoidal signals to slew rate enhancing modules 614 and 616, respectively. The oscillator 610 may be an LC oscillator, while the oscillator 612 may be a crystal oscillator.

Square wave conversion modules 618 and 620 receive distorted sinusoidal signals from the slew rate enhancing modules 614 and 616, respectively. A clock signal generated by the square wave conversion module 618 is used by digital logic 622. For example only, the digital logic 622 may provide base band processing, such as digital signal processing, for the RF transceiver 604. The slew rate enhancing module 614 and the square wave conversion module 618 may form a clock buffer 624.

A square wave signal generated by the square wave conversion module 620 is used by a mixer 626. For example only, the mixer 626 may down-mix a received signal to an intermediate frequency or to a baseband frequency. As another example, the mixer 626 may up-mix a baseband signal to the intermediate frequency or to a transmission frequency.

The broad teachings of the disclosure can be implemented in a variety of forms. Therefore, while this disclosure includes particular examples, the true scope of the disclosure should not be so limited since other modifications will become apparent upon a study of the drawings, the specification, and the following claims.

What is claimed is:

1. A slew rate enhancing system comprising:
    a first input configured to receive a first complementary signal of a differential pair;

a second input configured to receive a second complementary signal of the differential pair;
a first switch configured to selectively connect the first input to an output in response to a voltage of the second input being greater than a first predetermined voltage; and
a second switch configured to selectively connect the first input to the output in response to the voltage of the second input being less than a second predetermined voltage.

2. The slew rate enhancing system of claim 1, further comprising:
a third switch configured to selectively connect the second input to a second output in response to the voltage of the first input being less than the second predetermined voltage; and
a fourth switch configured to selectively connect the second input to the second output in response to a voltage of the first input being greater than the first predetermined voltage.

3. The slew rate enhancing system of claim 2, wherein:
the first switch and the fourth switch each include an N-channel metal-oxide-semiconductor field-effect transistor; and
the second switch and the third switch each include a P-channel metal-oxide-semiconductor field-effect transistor.

4. The slew rate enhancing system of claim 3, wherein:
the first predetermined voltage is a threshold voltage of the N-channel metal-oxide-semiconductor field-effect transistors; and
the second predetermined voltage is a threshold voltage of the P-channel metal-oxide-semiconductor field-effect transistors.

5. An oscillation system comprising:
the slew rate enhancing system of claim 2;
a fifth switch including (i) an input terminal connected to the output of the slew rate enhancing system and (ii) an output terminal connected to the second input of the slew rate enhancing system; and
a sixth switch including (i) an input terminal connected to the second output of the slew rate enhancing system and (ii) an output terminal connected to the first input of the slew rate enhancing system.

6. The oscillation system of claim 5, further comprising a reactive element connected between the first input of the slew rate enhancing system and the second input of the slew rate enhancing system.

7. The oscillation system of claim 6, wherein the reactive element comprises an inductor.

8. The oscillation system of claim 5, further comprising a current source connected to a third terminal of the fifth switch and a third terminal of the sixth switch.

9. The oscillation system of claim 5, further comprising:
a first reactive element connected between the first input of the slew rate enhancing system and a reference potential; and
a second reactive element connected between the second input of the slew rate enhancing system and the reference potential.

10. The oscillation system of claim 9, wherein the first reactive element comprises a first variable capacitor and the second reactive element comprises a second variable capacitor.

11. An oscillation system comprising:
an oscillator configured to generate the first complementary signal of the differential pair; and
the slew rate enhancing system of claim 1.

12. The oscillation system of claim 11, further comprising an inverter configured to generate the second complementary signal of the differential pair based on the first complementary signal of the differential pair.

13. The oscillation system of claim 11, wherein the oscillator includes one of a crystal oscillator or an LC oscillator.

14. The oscillation system of claim 11, wherein the oscillator comprises:
a crystal oscillator having a first terminal and a second terminal, wherein the first terminal is connected to the first input of the slew rate enhancing system, and wherein the second terminal is connected to the second input of the slew rate enhancing system; and
an inverter connected in between the first terminal and the second terminal.

15. The oscillation system of claim 14, wherein the oscillator comprises:
a first capacitor configured to connect the first terminal to a reference potential; and
a second capacitor configured to connect the second terminal to the reference potential.

16. A square wave generation system comprising:
the slew rate enhancing system of claim 1; and
a square wave conversion module configured to generate a square wave signal based on the output of the slew rate enhancing system.

17. The square wave generation system of claim 16, wherein the square wave conversion module comprises an inverter configured to generate the square wave signal based on the output of the slew rate enhancing system.

18. The square wave generation system of claim 17, wherein the square wave conversion module comprises a capacitor arranged in series between the output of the slew rate enhancing system and the inverter.

19. The square wave generation system of claim 17, wherein the square wave conversion module comprises a resistor configured to connect an input of the inverter to a bias voltage.

20. A radio frequency transceiver comprising the slew rate enhancing system of claim 1.

21. A mobile communications device comprising the radio frequency transceiver of claim 20.

* * * * *